US012326662B2

(12) United States Patent
Hamade et al.

(10) Patent No.: US 12,326,662 B2
(45) Date of Patent: Jun. 10, 2025

(54) METHOD FOR MANUFACTURING MICROSTRUCTURE INCLUDING CURED PRODUCTS OF PHOTOSENSITIVE RESIN COMPOSITIONS

(71) Applicant: CANON KABUSHIKI KAISHA, Tokyo (JP)

(72) Inventors: Yohei Hamade, Tokyo (JP); Kazunari Ishizuka, Shizuoka (JP); Satoshi Tsutsui, Kanagawa (JP); Miho Ishii, Kanagawa (JP); Haruka Yamaji, Tokyo (JP); Hikaru Sugimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 18/047,688

(22) Filed: Oct. 19, 2022

(65) Prior Publication Data

US 2023/0144597 A1  May 11, 2023

(30) Foreign Application Priority Data

Oct. 28, 2021 (JP) ................................. 2021-176486

(51) Int. Cl.
| | |
|---|---|
| *B41J 2/14* | (2006.01) |
| *B41J 2/16* | (2006.01) |
| *G03F 7/038* | (2006.01) |
| *G03F 7/039* | (2006.01) |
| *G03F 7/095* | (2006.01) |

(52) U.S. Cl.
CPC ............ *G03F 7/095* (2013.01); *B41J 2/1433* (2013.01); *B41J 2/162* (2013.01); *B41J 2/1631* (2013.01); *G03F 7/0385* (2013.01); *G03F 7/039* (2013.01)

(58) Field of Classification Search
CPC ........ G03F 7/095; G03F 7/0385; G03F 7/039; B41J 2/1433; B41J 2/162; B41J 2/1631; Y10T 29/494; Y10T 29/4904
See application file for complete search history.

(56) References Cited

U.S. PATENT DOCUMENTS

| | | | |
|---|---|---|---|
| 4,371,605 A | 2/1983 | Renner | |
| 9,707,759 B2 * | 7/2017 | Takahashi | ............. G03F 7/0757 |

(Continued)

FOREIGN PATENT DOCUMENTS

| | | |
|---|---|---|
| JP | 2000-330270 A | 11/2000 |
| JP | 2002-128750 A | 5/2002 |
| WO | 2007/109090 A2 | 9/2007 |

*Primary Examiner* — Donghai D Nguyen
(74) *Attorney, Agent, or Firm* — Venable LLP

(57) ABSTRACT

A method for manufacturing a microstructure comprising cured products of photosensitive resin compositions, the method comprising: a step of forming at least two layers of the photosensitive resin compositions each comprising a photopolymerization initiator; a step of subjecting each of the formed at least two layers of the photosensitive resin compositions to patterning exposure; and a step of collectively developing the exposed at least two layers of the photosensitive resin compositions to obtain a microstructure, wherein in the at least two layers of the photosensitive resin compositions, 90% by mass or more of the photopolymerization initiators contained in at least one of the two adjacent layers of the photosensitive resin compositions is a nonionic photopolymerization initiator.

10 Claims, 5 Drawing Sheets

(56) References Cited

U.S. PATENT DOCUMENTS 10,857,826 B2 * 12/2020 Matsuo .................... B41F 5/24
2007/0243662 A1 * 10/2007 Johnson ............. B81C 1/00269
438/106

* cited by examiner

METHOD FOR MANUFACTURING MICROSTRUCTURE INCLUDING CURED PRODUCTS OF PHOTOSENSITIVE RESIN COMPOSITIONS

BACKGROUND OF THE INVENTION

Field of the Invention

The present disclosure relates to a method for manufacturing a microstructure using a photosensitive resin composition, a method for manufacturing a liquid ejection head, a microstructure, and a liquid ejection head.

Description of the Related Art

In the field of advanced devices such as semiconductor devices and display panels, there is a method of processing a photosensitive material film into a microstructure by using a photolithography technique. Depending on the application of microstructures, as typified by microdevices, high precision is required even in three-dimensional finely detailed shapes.

WO 2007/109090 discloses a method for manufacturing a package composed of a laminate of two types of negative photosensitive resin layers. The manufacturing method is characterized by forming an integrated laminate having a width of the order of 10 m and an aspect ratio greater than 1:1.

SUMMARY OF THE INVENTION

Photo-radical, cationically, and anionically polymerizable resin materials are examples of photosensitive materials used when forming microstructures by photolithography. Among them, cationically polymerizable and anionically polymerizable resin materials are used for adhesives and semiconductor applications because of fewer restrictions on exposure environment and high adhesion to substrates. However, in a laminate configuration such as described in WO 2007/109090, initiators of different acidity and basicity are used for each layer (in consideration of patterning properties). It has been found that in this case, the interaction (salt exchange) between the initiators tends to occur near the layer interface. As a result, a phenomenon occurs in which the original function of the initiators cannot be exhibited, and a desired patterning shape may not be obtained.

Accordingly, the present disclosure provides a method for manufacturing a microstructure in which the interaction of initiators near layer interfaces in a laminate structure is suppressed and a desired shape can be formed, and also provides a method for manufacturing a liquid ejection head, a microstructure, and a liquid ejection head.

The present disclosure relates to a method for manufacturing a microstructure comprising cured products of photosensitive resin compositions, the method comprising:
 a step of forming at least two layers of the photosensitive resin compositions each comprising a photopolymerization initiator;
 a step of subjecting each of the formed at least two layers of the photosensitive resin compositions to patterning exposure; and
 a step of collectively developing the exposed at least two layers of the photosensitive resin compositions to obtain a microstructure, wherein
 in the at least two layers of the photosensitive resin compositions, 90% by mass or more of the photopolymerization initiators contained in at least one of the two adjacent layers of the photosensitive resin compositions is a nonionic photopolymerization initiator.

Also, another embodiment of the present disclosure relates to a method for manufacturing a liquid ejection head comprising the method for manufacturing a microstructure according to the above described method for manufacturing a microstructure, wherein
 the liquid ejection head comprises a substrate, a flow path forming member which is provided on the substrate and forms a liquid flow path, and an ejection port forming member which is provided on the flow path forming member and has an ejection port for ejecting the liquid;
 the step of forming the at least two layers of the photosensitive resin compositions is a step of forming two layers of a layer of a first photosensitive resin composition and a layer of a second photosensitive resin composition in this order on the substrate; and
 the flow path forming member is a cured product of the first photosensitive resin composition, and the discharge port forming member is a cured product of the second photosensitive resin composition.

Also, another embodiment of the present disclosure relates to a microstructure comprising cured products of at least two layers of photosensitive resin compositions, wherein
 the photosensitive resin compositions comprise a photopolymerization initiator, and
 in the at least two layers of the photosensitive resin compositions, 90% by mass or more of the photopolymerization initiators contained in at least one of the two adjacent layers of the photosensitive resin compositions is a nonionic photopolymerization initiator.

Also, another embodiment of the present disclosure relates to a liquid ejection head comprising a substrate, a flow path forming member which is provided on the substrate and forms a liquid flow path, and an ejection port forming member which is provided on the flow path forming member and has an ejection port for ejecting the liquid, wherein
 the flow path forming member is a cured product of a first photosensitive resin composition comprising a photopolymerization initiator;
 the discharge port forming member is a cured product of the second photosensitive resin composition comprising a photopolymerization initiator; and
 90% by mass or more of the photopolymerization initiators contained in at least one of the first photosensitive resin composition and the second photosensitive resin composition is a nonionic photopolymerization initiator.

According to the present disclosure, it is possible to provide a method for manufacturing a microstructure and a method for manufacturing a liquid ejection head in which the interaction of initiators near layer interfaces in a laminate structure is suppressed and a desired shape can be formed.

Further features of the present invention will become apparent from the following description of exemplary embodiments with reference to the attached drawings.

DESCRIPTION OF THE EMBODIMENTS

Figure 1A:
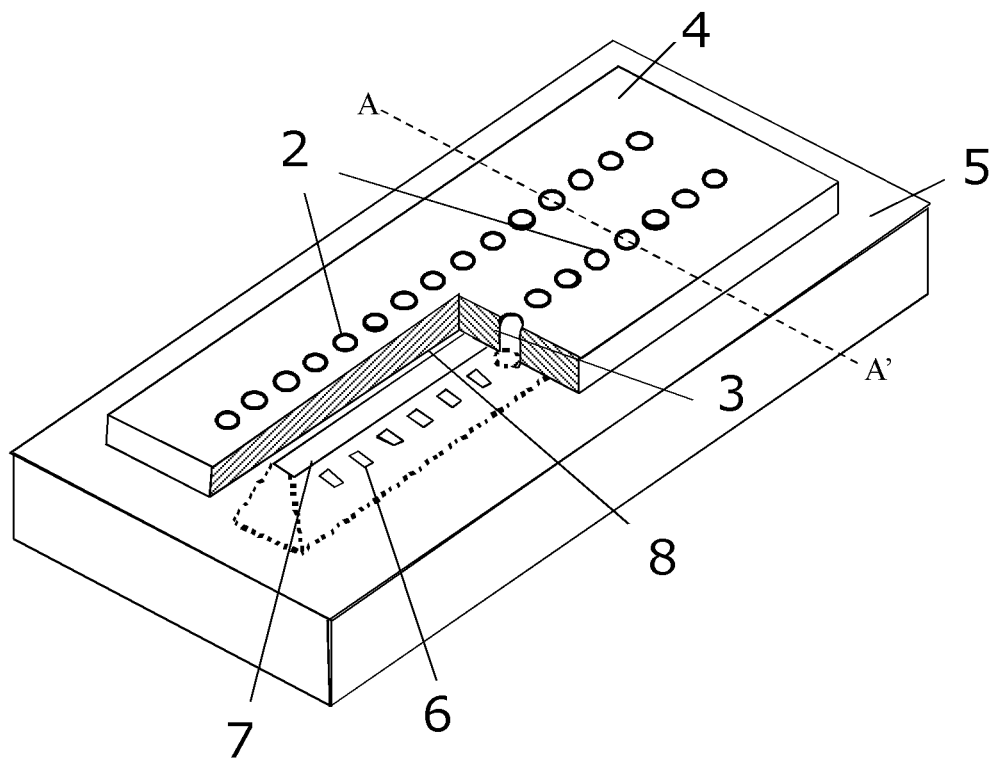
FIGS. 1A and 1B are schematic drawings of an inkjet recording head.

In the present disclosure, the terms "from XX to YY" and "XX to YY", which indicate numerical ranges, mean numerical ranges that include the lower limits and upper limits that are the end points of the ranges. In cases where numerical ranges are indicated incrementally, upper limits and lower limits of the numerical ranges can be arbitrarily combined.

The symbols in each drawing are as follows.

1: ink flow path, 2: ejection port, 3: nozzle, 4: ejection port forming member, 5: silicon substrate, 6: energy generating element, 7: supply port, 8: ink flow path forming member, 11: first photosensitive resin composition, 12: second photosensitive resin composition, 13: first photomask, 14: second photomask, 15: PET film, 16: inorganic material layer, 17: protection layer, 18: third photomask, 19: fourth photomask.

When an embodiment of the present disclosure is specifically illustrated with reference to the drawings, the dimensions, materials, shapes, relative positions, etc. of constituent parts described in this embodiment should be changed, as appropriate, according to the configuration of the members and various conditions to which the disclosure is applied. That is, the scope of this disclosure is not intended to be limited to the following embodiment.

A method for manufacturing a microstructure including cured products of photosensitive resin compositions has a step of forming a laminate of at least two layers of the photosensitive resin compositions. At least two layers of the photosensitive resin compositions each include a photopolymerization initiator. Further, the method for manufacturing a microstructure includes a step of subjecting each of the formed at least two layers of the photosensitive resin compositions to patterning exposure, and a step of collectively developing the exposed at least two layers of the photosensitive resin compositions to obtain a microstructure. The method is characterized by that in the at least two layers of the photosensitive resin compositions, 90% by mass or more of the photopolymerization initiators contained in at least one of the two adjacent layers of the photosensitive resin compositions is a nonionic photopolymerization initiator. This makes it possible to suppress the interaction between the initiators near the layer interface. Since nonionic photopolymerization initiators do not have a salt structure, a reaction between nonionic initiators or a reaction between a nonionic initiator and an ionic initiator does not occur, and therefore it is possible to suppress interactions such as salt exchange caused by ion exchange in each initiator.

In addition, the microstructure includes cured products of the at least two layers of the photosensitive resin compositions, and the photosensitive resin compositions include photopolymerization initiators. The microstructure is characterized by that in the at least two layers of the photosensitive resin compositions, 90% by mass or more of the photopolymerization initiators contained in at least one of the two adjacent layers of the photosensitive resin compositions is a nonionic photopolymerization initiator.

In the at least two layers of the photosensitive resin compositions, 90% by mass or more of the photopolymerization initiators contained in both of the two adjacent layers of the photosensitive resin compositions can be a nonionic photopolymerization initiator. Preferably, in the at least two layers of the photosensitive resin compositions, 90% by mass or more of the photopolymerization initiators contained in one of the two adjacent layers of the photosensitive resin compositions is a nonionic photopolymerization initiator. The photopolymerization initiator contained in the other of the two adjacent layers of the photosensitive resin compositions is preferably an ionic photopolymerization initiator.

The content ratio of the nonionic photopolymerization initiator among the photopolymerization initiators is preferably from 90% by mass to 100% by mass, more preferably from 95% by mass to 100% by mass, still more preferably from 98% by mass to 100% by mass, and particularly preferably 100% by mass.

Components constituting the at least two layers of the photosensitive resin compositions will be described by considering two layers of the photosensitive resin compositions as an example. First, the photosensitive resin composition forming the layer of the first photosensitive resin composition will be described. The first photosensitive resin composition is an example of a resin composition including a nonionic photopolymerization initiator in an amount of 90% by mass or more of the photopolymerization initiators. The first photosensitive resin composition is a negative photosensitive resin composition composed of a photosensitive resin, a nonionic photopolymerization initiator, and optionally a solvent and the like. Each constituent component will be described hereinbelow.

The First Photosensitive Resin Composition Which Forms the Layer of the First Photosensitive Resin Composition Photosensitive Resin An epoxy resin is preferably used as the photosensitive resin because of a high resolution of the formed pattern. The epoxy resin is not particularly limited, but from the viewpoint of reactivity and adhesion, an alicyclic epoxy resin, a cresol novolak type epoxy resin, a bisphenol A type epoxy resin, a bisphenol F type epoxy resin, a dicyclopentadiene type epoxy resin, and the like can be selected as appropriate. An epoxy resin having two or more epoxy groups in one molecule is preferable.

When a photobase generator is used as a nonionic polymerization initiator, the generated base is often weakly basic and may have low reactivity. Therefore, a highly reactive epoxy resin having a structure with low steric hindrance and a strongly polarized epoxy resin can be preferably used.

Specifically, the preferred epoxy resin is at least one selected from the group consisting of alicyclic epoxy resins, novolak type epoxy resins (e.g., cresol novolak type epoxy resins, phenol novolak type epoxy resins, and the like), 1,6-dihydroxynaphthalene type epoxy resins, bisphenol S type, A-type and F-type epoxy resins. More preferably, the epoxy resin is at least one selected from the group consisting of alicyclic epoxy resins, novolak type epoxy resins, 1,6-dihydroxynaphthalene type epoxy resins and bisphenol S type epoxy resins.

Examples of commercially available epoxy resins include "jER157S70" (trade name) manufactured by Mitsubishi Chemical Corp., "Epiclon HP-4032" (trade name) manufactured by DIC Corp., and "Denacol EX-251" (trade name) manufactured by Nagase ChemteX Corp.

Further, the epoxy equivalent of the epoxy resin is preferably 2000 or less, more preferably 1000 or less, and even more preferably 500 or less. Although the lower limit is not particularly limited, it is preferably 50 or more, more preferably 100 or more. When the epoxy equivalent is 2000 or less, the crosslinking density does not decrease during the curing reaction, and a decrease in the glass transition temperature and adhesion of the cured product can be prevented. The epoxy equivalent is a value measured according to JIS K-7236.

Nonionic Photopolymerization Initiator

There are two types of nonionic photopolymerization initiators: photoacid generators and photobase generators, both of which can be used. The nonionic photoacid generator and photobase generator are not particularly limited, and known ones can be used. The nonionic photopolymerization initiator is preferably a photobase generator.

Specific examples of nonionic photoacid generators include benzoin ester of toluenesulfonic acid, o- or p-nitrobenzyl ester of toluenesulfonic acid, 2,6-dinitrobenzyl ester of toluenesulfonic acid; and N-hydroxyamides and N-hydroxysulfonates described in U.S. Pat. No. 4,371,605; arylnaphthoquinonediazide-4-sulfonates, and the like.

Examples of commercially available nonionic photoacid generators include "NAI-105", "SI-100", "NDI-105" and "PI-105" (trade names) manufactured by Midori Kagaku Co., Ltd.

In addition, as a specific example of the nonionic photobase generator, at least one selected from the group consisting of imidazole-based photobase generators and amine-based photobase generators, which have a catalytic effect on curing of epoxy resins, is preferable. At least one selected from the group consisting of amine-based photobase generators is more preferred. For example, 9-anthrylmethyl N,N-diethylcarbamate, (2-nitrophenyl)methyl 4-(methacryloyloxy)piperidine-1-carboxylate, (E)-1-piperidino-3-(2-hydroxyphenyl)-2-propen-1-one, and the like can be used.

Examples of commercially available nonionic photobase generators include "WPBG-018", "WPBG-027", "WPBG-140" and "WPBG-165" (trade names) manufactured by FUJIFILM Wako Pure Chemical Corp. In particular, when i-ray exposure is performed, a base generator can be preferably used because there are almost no photoacid generators having an i-ray absorption wavelength.

Also, the amount (addition amount) of the nonionic photopolymerization initiator in the photosensitive resin composition is not particularly limited as long as the concentration is such that the epoxy resin can be cured. Specifically, the amount is preferably from 0.1 parts by mass to 20 parts by mass, more preferably from 0.5 parts by mass to 10 parts by mass, based on 100 parts by mass of the epoxy resin.

In addition, as described above, in the case of nonionic photobase generators, the generated bases are all weakly basic, so in order to increase the reactivity of the resin, it is preferable to use also a sensitizer or a base proliferating agent. That is, the photosensitive resin composition including a photobase generator as a nonionic photopolymerization initiator preferably includes a sensitizer.

Any substance can be used as the sensitizer as long as a base is efficiently generated by photosensitizing. Specific examples of suitable sensitizers include 1,2-dicyclohexyl-4,4,5,5-tetramethylbiguanidinium=n-butyltriphenylborate and (Z)-{[bis(dimethylamino)methylidene]amino}-N-cyclohexyl(cyclohexylamino)methaniminium.

In addition, the photosensitive resin composition including a photobase generator as a nonionic photopolymerization initiator preferably includes a base proliferating agent. A base proliferating agent is a substance that is decomposed by the action of a base to generate a basic substance, and any such substance can be used without particular limitation.

Specific examples include the compounds described in Japanese Patent Application Publication No. 2000-330270 and Japanese Patent Application Publication No. 2002-128750. For example, a urethane-based compound having a structure represented by a following formula (1) can be used.

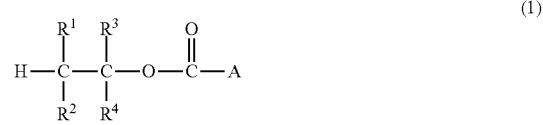

(1)

In the formula (1), $R^1$ and $R^2$ each independently represent a hydrogen atom, a substituent or an electron-withdrawing group, and at least one of them represents an electron-withdrawing group. $R^3$ and $R^4$ each independently represent a hydrogen atom or a substituent, and A represents an amino group.

Examples of the electron-withdrawing group include electron-withdrawing groups commonly used in organic electron theory or the like, such as a fluorenyl group, organic sulfoxide groups, a cyano group, a nitro group, an ester group, a carbonyl group, an amide group, a pyridyl group, and the like. A fluorenyl group is preferred.

Examples of the substituent include an alkyl group having 1 to 12 (preferably 1 to 6) carbon atoms, a cycloalkyl group having 5 to 10 (preferably 6 to 8) carbon atoms, an aryl group having 6 to 14 (preferably 6 to 10) carbon atoms, an arylalkyl group having 7 to 15 (preferably 7 to 11) carbon atoms, and the like. Specific examples include methyl, ethyl, propyl, butyl, cyclohexyl, phenyl, tolyl, naphthyl, benzyl, phenethyl, naphthylmethyl, and the like.

The amino group is inclusive of an unsubstituted amino group and a substituted amino group. The substituted amino group is inclusive of a monosubstituted amino group and a disubstituted amino group. An amino group can be represented by $-NR^5R^6$. $R^5$ and $R^6$ represent hydrogen or an organic group. The number of carbon atoms in the organic group is from 1 to 18 and preferably from 6 to 12. The organic group is inclusive of an alkyl group, a cycloalkyl group, an aryl group, and an arylalkyl group.

The urethane-based compound used as a base proliferating agent can include two or more urethane bonds. Examples of such urethane-based compound include those represented by the following formula (2).

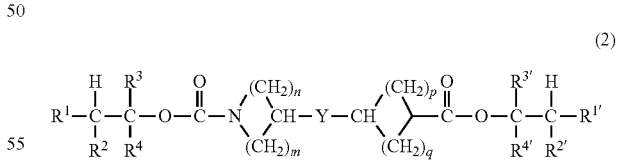

(2)

In the formula (2), $R^1$ and $R^2$ are each independently a hydrogen atom, a substituent or an electron-withdrawing group, at least one of which is an electron-withdrawing group. $R^3$ and $R^4$ are each independently a hydrogen atom or a substituent. $R^{1'}$ and $R^{2'}$ are each independently a hydrogen atom, a substituent or an electron-withdrawing group, at least one of which is an electron-withdrawing group. $R^{3'}$ and $R^{4'}$ are each independently a hydrogen atom or a substituent. Y is an alkylene group having 1 to 8 (preferably 2 to 6) carbon atoms. n and m are integers of 1 to 6 (preferably 2 to 4). n+m is 4 to 12 (preferably 4 to 8). p and q are integers of 1 to 6 (preferably 2 to 4). p+q is 4 to 12 (preferably 4 to 8).

Examples of electron-withdrawing groups and substituents are the same as those in the formula (1). The base proliferating agent is particularly preferably 4,4'-[bis[[(9-fluorenylmethyl)oxy]carbonyl]trimethylene]dipiperidine.

The amounts (addition amount) of the sensitizer and base proliferating agent in the photosensitive resin composition are not particularly limited as long as the concentration thereof is such that the epoxy resin can be cured. Specifically, each amount is preferably from 0.1 parts by mass to 20 parts by mass, more preferably from 0.5 parts by mass to 10 parts by mass with respect to 100 parts by mass of the epoxy resin.

Furthermore, an additive and the like can be added, as necessary and appropriate, to the photosensitive resin composition. For example, a silane coupling agent or the like may be added for the purpose of improving adhesion. A silane coupling agent having an epoxy group or a glycidyl group is preferred. Commercially available products can be exemplified by "SILQUEST A-187" (trade name) manufactured by Momentive Performance Materials Co., Ltd. Although the amount of the silane coupling agent is not particularly limited, it is preferably from 1 part by mass to 30 parts by mass and more preferably from 2 parts by mass to 15 parts by mass based on 100 parts by mass of the solid fraction of the epoxy resin.

Solvent

The photosensitive resin composition may include a solvent. The solvent is not particularly limited as long as the photosensitive resin and the nonionic photopolymerization initiator can be uniformly dispersed therein. For example, xylene and propylene glycol monomethyl ether acetate (PGMEA) are suitable from the viewpoint of resin solubility and coatability.

From the viewpoint of coatability, the amount of the solvent in the photosensitive resin composition (the total amount in the case of two or more types) is preferably from 60 parts by mass to 200 parts by mass and more preferably from 70 parts by mass to 150 parts by mass with respect to 100 parts by mass (solid fraction) of the photosensitive resin.

Next, the second photosensitive resin composition which forms the layer of the second photosensitive resin composition will be described. The second photosensitive resin composition is an example of a photosensitive resin composition used for the other photosensitive resin composition layer of the two adjacent photosensitive resin composition layers described above. The photosensitive resin composition forming the layer of the second photosensitive resin composition is a negative photosensitive resin composition including a photosensitive resin, a photopolymerization initiator, and optionally a solvent and the like. Each constituent component will be described below.

The Second Photosensitive Resin Composition Which Forms the Layer of the Second Photosensitive Resin Composition Photosensitive Resin As the photosensitive resin, a resin can be selected from the same viewpoint as the first photosensitive resin. In particular, by using the same resin as the first photosensitive resin, the coefficients of linear expansion can be brought closer to each other, thereby ensuring high adhesion.

Photopolymerization Initiator

The photopolymerization initiator can be ionic or nonionic, or photopolymerization initiators of both types can be used. As the nonionic photopolymerization initiator, the same one as mentioned in relation to the first photosensitive resin composition can be used. Any ionic photopolymerization initiator can be used as long as the photosensitive resin can be cured. In the at least two layers of the photosensitive resin compositions, the photopolymerization initiator contained in the other of the two adjacent layers of the photosensitive resin compositions is preferably an ionic photoacid generator.

Specific examples of photoacid generators include sulfonate esters, carboxylic acid esters, and onium salts. Commercially available photoacid generators include CPI-410S (trade name) manufactured by San-Apro Ltd., ADEKA ARKLS SP-150, SP-151, SP-170, SP-171, and SP-172 (trade names) (manufactured by ADEKA Corp.), and the like.

Specific photobase generators include carbamate derivatives and oxime ester derivatives. Commercially available photobase generators include CGI-325, Irgacure OXE01, Irgacure OXE02 (trade names) (manufactured by BASF Japan Ltd.), N-1919, and NCI-831 (trade names) (manufactured by ADEKA Corp.), and the like.

The amount (addition amount) of the photopolymerization initiator in the second photosensitive resin composition is not particularly limited as long as the concentration thereof is such that the photosensitive resin can be cured. Specifically, the amount is preferably from 0.1 parts by mass to 20 parts by mass and more preferably from 0.5 parts by mass to 10 parts by mass with respect to 100 parts by mass of the photosensitive resin.

The second photosensitive resin composition, like the first photosensitive resin composition, optionally may include an additive such as a sensitizer, a base proliferating agent, a solvent, and a silane coupling agent.

Next, the manufacturing methods will be explained.

Method for Manufacturing Microstructure

A method for manufacturing a microstructure is as follows.

A method for manufacturing a microstructure includes a step of forming at least two layers of the photosensitive resin compositions each including a photopolymerization initiator, a step of exposing the formed layers of the photosensitive resin compositions to patterning exposure, and a step of collectively developing (removing unexposed portion) the exposed at least two layers of the photosensitive resin compositions to obtain a microstructure. In the at least two layers of the photosensitive resin compositions, 90% by mass or more of the photopolymerization initiators contained in at least one of the two adjacent layers of the photosensitive resin compositions is a nonionic photopolymerization initiator.

The at least two layers of the photosensitive resin compositions are preferably formed on a substrate. The substrate is not particularly limited, and for example, a substrate made of silicon can be used.

The at least two layers of the photosensitive resin compositions are preferably two to four layers of the photosensitive resin compositions, more preferably two or three layers of the photosensitive resin compositions, and even more preferably two layers of the photosensitive resin compositions.

For example, in the case of three layers of the photosensitive resin compositions, the central layer among the three layers may include a nonionic photopolymerization initiator in an amount of 90% by mass or more of the photopolymerization initiators. Alternatively, of the three layers, the first layer and the third layer may include a nonionic photopolymerization initiator in an amount of 90% by mass or more of the photopolymerization initiators.

The method for manufacturing a microstructure preferably includes a step of forming a layer of a first photosensitive resin composition, a step of forming a layer of a second photosensitive resin composition, a step of subjecting the layer of the first photosensitive resin composition to patterning exposure, a step of subjecting the layer of the second photosensitive resin composition to patterning exposure, and a step of collectively developing the exposed layers of the first and second photosensitive resins to manufacture a microstructure.

Here, in a case where the layer of the second photosensitive resin composition is provided on the layer of the first photosensitive resin composition, when each layer is to be patterned, each layer is subjected to patterning exposure. Therefore, it is preferable to change the exposure sensitivity of the polymerization initiator between the upper layer and the lower layer, for example, by using a nonionic initiator with lower sensitivity in the lower layer so that the lower layer is not sensitized when the upper layer is exposed. That is, in the step of patterning exposure, the layer including a nonionic photopolymerization initiator in an amount of 90% by mass or more of the photopolymerization initiators, of the at least two layers of the photosensitive resin compositions, is preferably located on the opposite side of the light source in an exposure irradiation direction.

Further, when providing a plurality of layers of the photosensitive resin compositions, it is preferable to change the exposure sensitivity of the polymerization initiators in the plurality of layers as well.

Method for Manufacturing Liquid Ejection Head

An example of a microstructure is a liquid ejection head. That is, a method for manufacturing a liquid ejection head includes the method for manufacturing a microstructure, and the photosensitive resin compositions can be applied to the liquid ejection head. The step of forming at least two layers of photosensitive resin compositions is a step of forming two layers of a layer of a first photosensitive resin composition and a layer of a second photosensitive resin composition in this order on a substrate. The liquid ejection head includes a substrate, a flow path forming member that is provided on the substrate and forms a liquid flow path, and an ejection port forming member that is provided on the flow path forming member and has an ejection port for ejecting the liquid. The flow path forming member is a cured product of the first photosensitive resin composition, and the discharge port forming member is a cured product of the second photosensitive resin composition.

As an example, a method for manufacturing an inkjet recording head, which is one form of a liquid ejection head, will be described hereinbelow. This is a method for manufacturing a liquid ejection head provided with at least a substrate, a flow path forming member that is provided on the substrate and forms a liquid flow path, and an ejection port forming member that is provided on the flow path forming member and has an ejection port for ejecting the liquid. The manufacturing method includes at least a step of laminating two layers of a layer of a first photosensitive resin composition and a layer of a second photosensitive resin composition each including a photopolymerization initiator on the substrate, a step of subjecting each of the photosensitive resin compositions of the two layers to patterning exposure, and a step of collectively developing (removing the unexposed portion) the exposed at least two layers of the photosensitive resin compositions to form a flow channel forming member and a discharge port forming member on the substrate. Further, 90% by mass or more of the photopolymerization initiators contained in at least one of the two layers of the photosensitive resin compositions is a nonionic photopolymerization initiator.

In the step of forming the layer of the first photosensitive resin composition and the step of forming the layer of the second photosensitive resin composition, for example, the photosensitive resin composition may be coated to form a coating film. The coating method is not particularly limited as long as a uniform film can be formed.

For example, a spin coating method or a slit coating method can be used. Further, when coating the second photosensitive resin composition on the layer of the first photosensitive resin composition, there is a concern that the resin layers will be compatible with each other. Therefore, a method of attaching the second photosensitive resin composition or both the first and second photosensitive resin compositions as layers obtained by forming dry films can be preferably used. By using this method, compatibility between the layers of the first and second photosensitive resin compositions can be prevented, and deterioration of the patterning property of each layer can be prevented.

Next, after exposing the layer of the first photosensitive resin composition corresponding to the lower layer, the second layer of the photosensitive resin composition corresponding to the upper layer is exposed.

When using a negative photosensitive resin composition as described above, a heating step may be performed after the exposure with a wavelength at which the photocuring reaction of the resin composition proceeds. At this time, since there is a possibility that a catalyst may diffuse into unexposed areas due to retention after exposure, it is preferably, in terms of patterning accuracy, that heat treatment be performed immediately after the exposure. Therefore, the layer of the first photosensitive resin composition and the layer of the second photosensitive resin composition are preferably heat-treated immediately after the exposure.

In the case of patterning exposure of a plurality of layers, such as the layer of the first photosensitive resin composition and the layer of the second photosensitive resin composition, with light of the same wavelength, it is preferable to adjust the exposure dose in the exposure of each layer so that the exposure of each layer does not sensitize the other layer. Specifically, it is preferable that the exposure doses of the layer of the first photosensitive resin composition and the layer of the second photosensitive resin composition differ from each other by a factor of about five, so that the first photosensitive resin layer, which is the lower layer, is not sensitized at the time of patterning exposure of the layer of the second photosensitive resin composition.

For example, for the layer of the second photosensitive resin composition, the exposure dose is preferably from 500 $J/m^2$ to 4000 $J/m^2$, and more preferably from 800 $J/m^2$ to 3000 $J/m^2$. For the layer of the first photosensitive resin composition the exposure dose is preferably from 5000 $J/m^2$ to 30,000 $J/m^2$ or more, and more preferably from 8000 $J/m^2$ to 22,000 $J/m^2$ or more. Such a difference in exposure dose can be provided by selecting a photopolymerization initiator or adjusting the addition amount thereof.

Further, the heat treatment temperature after exposure is preferably adjusted to 70° C. or higher in order to advance the reaction so that the exposed portion pattern is not removed during the development step. More preferably, the heat treatment temperature is 80° C. or higher. Although the upper limit is not particularly limited, it is preferably 120° C. or lower, and more preferably 100° C. or lower.

As for the cured state of the resin compositions before the development, when an epoxy resin is used as the photosensitive resin of the first or second photosensitive resin composition, the reaction rate of the epoxy group of the epoxy resin (epoxy group ring-opening rate) is preferably 50% or more. The epoxy group ring-opening rate is more preferably 80% or more, still more preferably 90% or more, and even more preferably 95% or more. Although the upper limit is not particularly limited, it is preferably 100% or less, and more preferably 99% or less. A method for obtaining the ring-opening rate of the epoxy group will be described hereinbelow. The epoxy group ring-opening rate indicates the ring-opening ratio of epoxy groups in the epoxy resin composition.

The epoxy group ring-opening rate can be calculated using an epoxy group-derived peak area on the basis of the absorbance spectrum of the epoxy resin composition obtained by Fourier transform infrared spectroscopy (FT-IR). Here, the "epoxy group-derived peak area" refers to the peak derived from the epoxy group located near the wave number of 910 cm$^{-1}$, and is the integral value obtained when the line connecting the left and right minimum values closest to this peak is taken as a baseline.

Specifically, the epoxy group ring-opening rate E (%) is calculated using the following formula, where X is the peak area in the absorbance spectrum before the exposure and Y is the peak area in the absorbance spectrum after the exposure.

$$E(\%)=[(X-Y)/X]\times 100$$

Next, the layer of the first photosensitive resin composition and the layer of the second photosensitive resin composition, which have been exposed, may be developed collectively to manufacture a fine pattern. As a developer to be used for development, a solvent capable of dissolving an uncured epoxy resin is suitable.

Specifically, it is preferable to use a ketone-based organic solvent such as propylene glycol monomethyl ether acetate, methyl ethyl ketone, methyl isobutyl ketone, and the like.

Further, after the development, it is preferable to perform heat treatment (main baking) at a temperature of 140° C. or higher for the purpose of promoting curing of the resin compositions. Moreover, from the viewpoint of preventing cracks due to increased film stress, the film stress of the cured product obtained by the heat treatment (main baking) is preferably 20 MPa or less.

Here, a method for obtaining the film stress of the cured product will be explained.

In order to check the stress difference in the cured product itself, a sample is prepared that has been exposed over the entire surface instead of being subjected to patterning exposure in the exposure step. Immediately after curing the sample, a laser reflection type warp measuring machine (FLX-2320-S, manufactured by KLA-Tencor Corp.) is used to measure a warp change amount before and after film formation, and the calculated internal stress is taken as the film stress of the cured product.

Figure 1B:
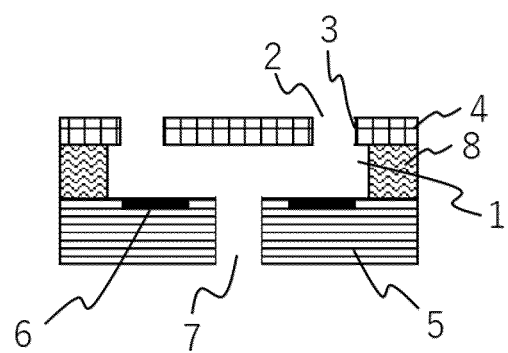

Further, since the microstructure formed by the method according to the present disclosure has high resolution and also high mechanical strength, the microstructure is suitable for processing into microstructures in various advanced device fields, especially for forming nozzles for inkjet heads. For example, as shown in FIGS. 1A and 1B, the first photosensitive resin composition can be used as an ink flow path forming member 8 that forms an ink flow path 1, and the second photosensitive resin composition can be used as an ejection port forming member 4 that forms an ejection port 2 and a nozzle 3.

EXAMPLES

The present invention will now be explained in greater detail by means of the following working examples and comparative examples, but is in no way limited to these examples. Moreover, "parts" in formulations below are on a mass basis unless explicitly stated otherwise.

Examples 1 to 8, Comparative Example 1

Preparation of Sample of Microstructure

Figure 2:
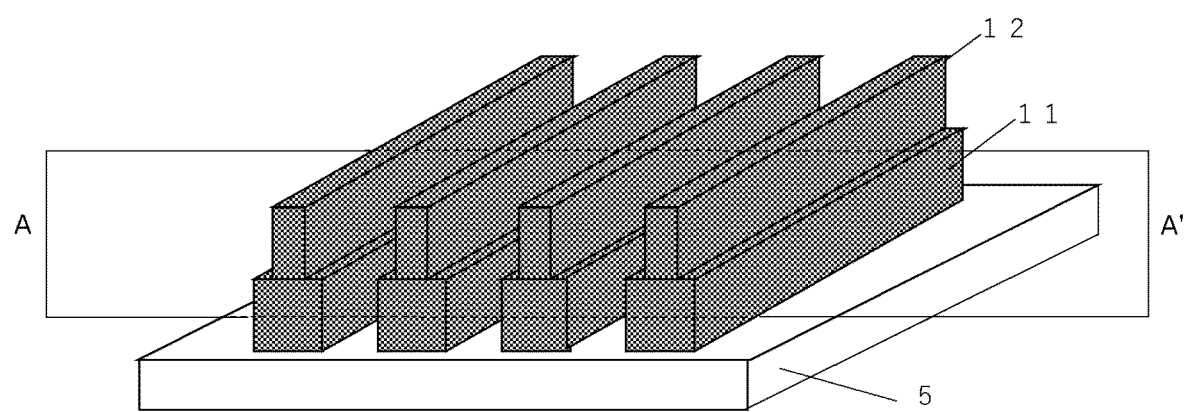
FIG. 2 is a perspective view of an example of a microstructure.

A microstructure shown in FIG. 2 was prepared. FIGS. 3A to 3E shows a schematic cross-sectional view taken along line A-A' in FIG. 2.

First, as the first and second photosensitive resin compositions, epoxy resins, polymerization initiators, other additives and solvents were mixed in the compositions (parts by mass) shown in Table 1, and stirred at room temperature for 3 days to obtain homogeneous solutions. Microstructures were produced using the first and second photosensitive resin compositions in combinations of Examples 1 to 8 and Comparative Example 1 in Table 1.

Figure 3A:
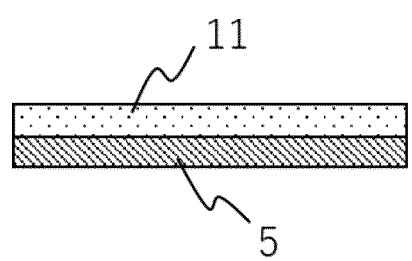
FIGS. 3A to 3E are cross-sectional views showing a method for forming a microstructure.

Next, as shown in FIG. 3A, the first photosensitive resin composition was coated to a film thickness of 25 μm on a silicon substrate 5, and the coating was heat-treated at 60° C. for 9 min to form a layer of a first photosensitive resin composition 11.

Meanwhile, a second photosensitive resin composition 12 was cast on a PET film FB50 Lumirror (manufactured by Toray Industries, Inc.) as a base film by a solution casting method so as to have a film thickness of 20 m, and the cast film was heated at 90° C. for 5 min after drying and then wound up. Then, a PET film Purex A31 (manufactured by Teijin DuPont Films Ltd.) as a cover film was placed and heat-treated at 50° C. for 1 min.

Figure 3B:
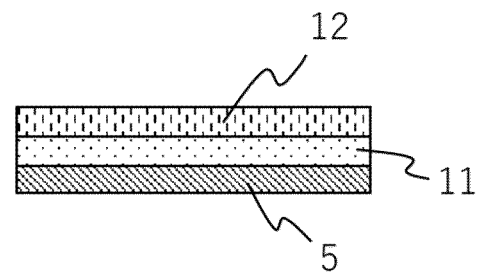

Next, the cover film was peeled off from the second photosensitive resin layer. Then, as shown in FIG. 3B, the cover film was overlaid so that the layer surface of the first photosensitive resin composition 11 and the layer surface of the second photosensitive resin composition 12 were aligned, and a lamination method was used to perform transfer while applying heat at 70° C. and pressure and form a layer of the second photosensitive resin composition 12.

Figure 3C:
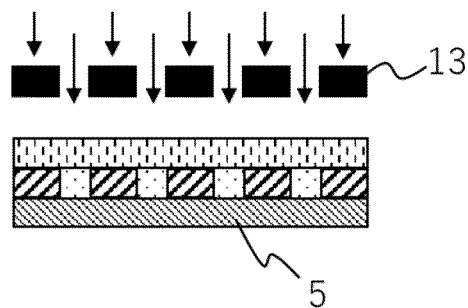

Further, as shown in FIG. 3C, the layer of the first photosensitive resin composition 11 was exposed by a radiant energy at an illumination dose of 20,000 J/m$^2$ through a first photomask 13 by using an i-ray exposure stepper (manufactured by Canon Inc.). Here, the pattern shape for confirming the shape of the microstructure was set to line/space=20 μm/20 μm. After that, heat treatment was performed at 90° C. for 4 min.

Figure 3D:
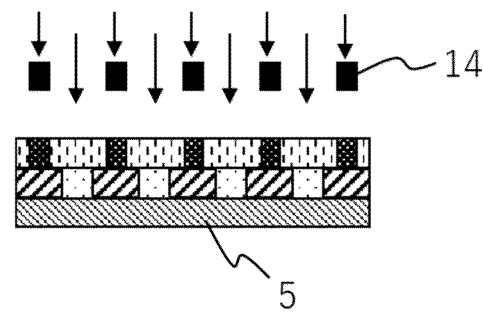

Next, as shown in FIG. 3D, the layer of the second photosensitive resin composition 12 was exposed by a radiant energy at an illumination dose of 2,000 J/m$^2$ through a second photomask 14 by using the i-ray exposure stepper (manufactured by Canon Inc.). Here, the pattern shape for confirming the shape of the microstructure was set to line/space=10 μm/30 μm. After that, heat treatment was performed at 90° C. for 4 min.

Figure 3E:
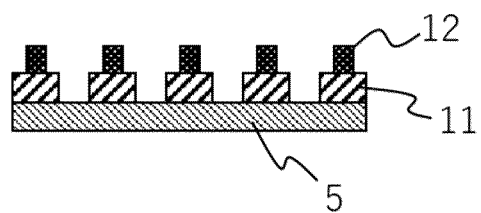

Next, a microstructure was obtained by removing the uncured portions of the first photosensitive resin composition 11 and the second photosensitive resin composition 12 by developing with propylene glycol monomethyl ether acetate (PGMVEA) for 10 min and then curing by heating at 200° C. (FIG. 3E).

Fabrication of Inkjet Recording Head

FIGS. 5A to 5J illustrate a method of forming an inkjet recording head. Ink jet recording heads were produced using

TABLE 1

| Item | Material name | Product name | Example 1 | 2 | 3 | 4 | 5 | 6 | 7 | 8 | Comparative Example 1 |
|---|---|---|---|---|---|---|---|---|---|---|---|
| First photosensitive resin composition | Epoxy resin | Mitsubishi Chemical Corp. 157S70 | 100 | 100 | | | 100 | 100 | 100 | 100 | 100 |
| | | DIC Corp. HP-4032 | | | 100 | | | | | | |
| | | Nagase Chemtex Corp. Denacol EX-251 | | | | 100 | | | | | |
| | Nonionic photobase generator | FUJIFILM Wako Pure Chemical Corp. WPBG-018 | 1 | 1 | 1 | 1 | | 1 | 1 | 1 | |
| | Photoacid generator | San-Apro Ltd. CPI-410S | | | | | 1 | | | | 1 |
| | Photosensitizer | FUJIFILM Wako Pure Chemical Corp. 1,2-Dicyclohexyl-4,4,5,5-tetramethyl-biguanidinium=n-butyltriphenylborate | | 2.5 | | | | 2.5 | | 2.5 | |
| | Base proliferating agent | — 4,4'-[Bis[(9-fluorenylmethyl)oxy]carbonyl]trimethylene]dipiperidine | | | | | | 1 | 1 | 1 | |
| | Other additives | Momentive Performance Materials Co., Ltd. A-187 | 5 | 5 | 5 | 5 | 5 | 5 | 5 | 5 | 5 |
| | Solvent | Showa Denko K.K. PGMEA | 140 | 140 | 140 | 140 | 140 | 140 | 140 | 140 | 140 |
| Second photosensitive resin composition | Epoxy resin | Mitsubishi Chemical Corp. 157S70 | 100 | 100 | 100 | 100 | 100 | 100 | 100 | 100 | 100 |
| | Nonionic photobase generator | FUJIFILM Wako Pure Chemical Corp. WPBG-018 | | | | | 1 | | 1 | | |
| | Photoacid generator | ADEKA Corp, ADEKA ARKLS SP-172 | 1 | 1 | 1 | 1 | | 1 | | 1 | 1 |
| | Solvent | Showa Denko K.K. PGMEA | 140 | 140 | 140 | 140 | 140 | 140 | 140 | 140 | 140 |
| Evaluation | Epoxy group ring-opening rate | First photosensitive resin composition/% | 95 | 99 | 95 | 95 | 95 | 99 | 95 | 99 | 99 |
| | | Second photosensitive resin composition/% | 99 | 99 | 99 | 99 | 95 | 99 | 99 | 99 | 99 |
| | Patterning property | θ/° | 88 | 89 | 89 | 89 | 88 | 90 | 89 | 88 | 80 |
| | | Printing performance | B | A | A | A | B | A | A | B | C |

Evaluation Results

Figure 4:
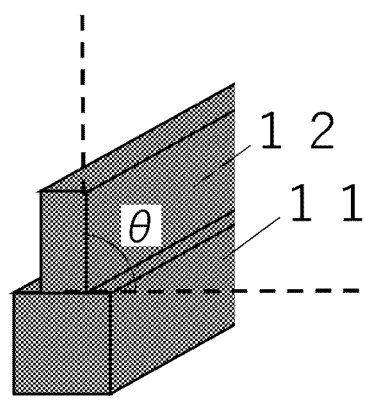
FIG. 4 explains an angle θ formed between the patterns of the microstructure

The results are shown in Table 1. The angle θ formed between the patterns of the layer of the first photosensitive resin composition and the layer of the second photosensitive resin composition such as shown in FIG. 4 was measured. Examples 1 to 8 showed verticality close to 90°, and good patterns were obtained. Meanwhile, in Comparative Example 1, the verticality was deteriorated, and the patterning property was deteriorated. Therefore, in Examples 1 to 8, it is considered that the interaction due to the initiator between the layer does not occur. Meanwhile, in Comparative Example 1, it is considered that the angle θ became smaller because the initiator between the layers was salt-exchanged and the sensitivity of the second photosensitive resin composition was increased.

Epoxy Group Ring-Opening Rate

Using a "VARIAN 600 UMA FT-IR Microscope" (trade name, manufactured by VARIAN, Inc.), the epoxy group ring-opening rate was calculated by measuring the epoxy group-derived peak area (near wave number 910 cm$^{-1}$) before and after the sample was exposed. There was no problem with the reactivity before development, and no peeling occurred due to development.

the first and second photosensitive resin in combinations of Examples 1 to 8 and Comparative Example 1 shown in Table 1.

Figure 5A:
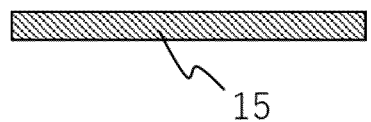
FIGS. 5A to 5J are examples of a method for forming an inkjet recording head
Figure 5B:
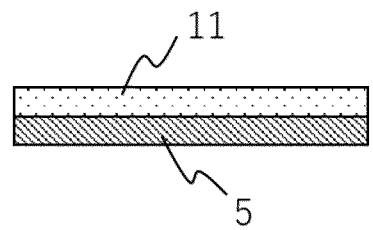
Figure 5C:
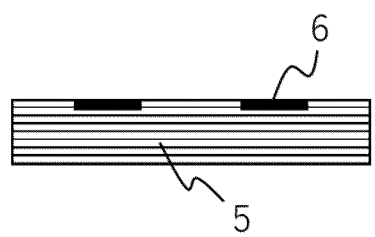

First, as shown in FIG. 5A, a PET film 15 with a thickness of 100 μm was prepared. Next, as shown in FIG. 5B, the first photosensitive resin composition 11 shown in Table 1 was coated onto a PET film 15 by spin coating and baked at 90° C. for 10 min to volatilize a PGMEA solvent and form a film of 15.0 μm. Next, as shown in FIG. 5C, a silicon substrate 5 having energy generating elements 6 made of TaSiN on the surface side was prepared.

Figure 5D:
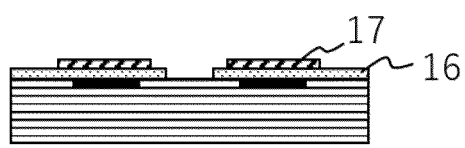

Next, as shown in FIG. 5D, SiCN was deposited as an inorganic material layer 16 on the surface side of the silicon substrate 5 by a plasma CVD method to a thickness of 0.3 μm so as to cover energy generating elements 6. Subsequently, Ta was formed with a thickness of 0.25 μm as a protective layer 17 by a sputtering method. Then, the inorganic material layer 16 and the protective layer 17 were patterned by photolithography and reactive ion etching.

Figure 5E:
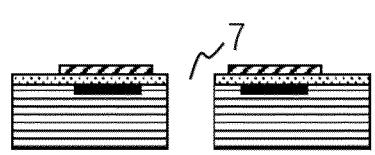

Next, a supply port 7 was formed as shown in FIG. 5E. The supply port 7 was formed by forming an etching mask having an opening by using a positive photosensitive resin made of OFPR (manufactured by Tokyo Ohka Kogyo Co., Ltd.) and performing reactive ion etching through the openings of the etching mask. The reactive ion etching was performed by the Bosch process using an ICP etching apparatus (manufactured by Alcatel, model number: 8E). After forming the supply port 7, the etching mask was removed using a stripping solution.

Figure 5F:
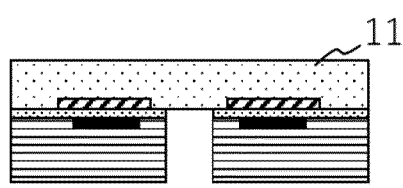

Next, as shown in FIG. 5F, the first photosensitive resin composition (1) 11 was formed. Specifically, a film having the first photosensitive resin composition 11 produced as shown in FIG. 5B was transferred by a lamination method (pressurizing under heating treatment at 70° C.) onto the silicon substrate 5 in which the energy generating element 6 and the supply port 7 had been arranged. After that, the PET film 15 was peeled off from the first photosensitive resin composition 11 with a peeling tape (not shown in FIGS.).

Figure 5G:
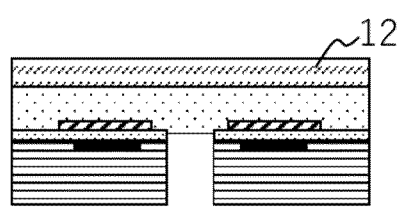

Next, as shown in FIG. 5G, the second photosensitive resin composition 12 was formed. First, the second photosensitive resin composition 12 shown in Table 1 was coated on a PET film having a thickness of 100 µm and baked at 90° C. for 5 min to volatilize the solvent and form a film having a thickness of 5.0 µm. Next, the second photosensitive resin composition 12 was transferred and laminated on the first photosensitive resin composition 11 using a lamination method while applying heat at 50° C.

Figure 5H:
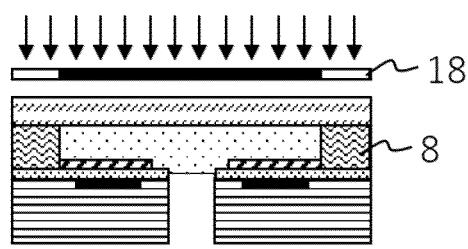

Next, as shown in FIG. 5H, the photosensitive resin composition 11 was subjected to pattern exposure at an exposure dose of 10,000 J/m$^2$ with an i-ray exposure stepper (manufactured by Canon Inc., product name: i5) through a third photomask 18 having a flow path pattern. Thereby, a latent image of the flow path forming member 8 was formed.

Figure 5I:
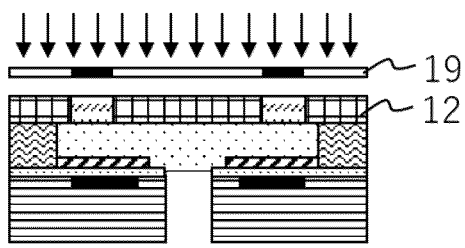

Next, as shown in FIG. 5I, the second photosensitive resin composition 12 was subjected to pattern exposure at an exposure dose of 1100 J/m$^2$ through a fourth photomask 19 having an ejection port pattern with the i-ray exposure stepper (manufactured by Canon Inc., product name: i5). Further, heat treatment was performed at 90° C. for 5 min to cure the exposed portion, and the ejection port forming member 4 was formed.

Figure 5J:
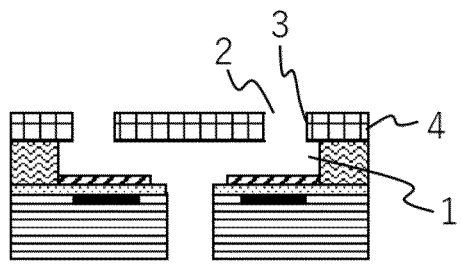

Next, as shown in FIG. 5J, the uncured portions of the first photosensitive resin composition 11 and the second photosensitive resin composition 12 were collectively removed by developing with PGMEA for 1 h, and the ink flow path 1, the ejection port 2, and the nozzle 3 were formed and cured with heat at 200° C. to obtain a liquid ejection head.

Evaluation

Printing characteristics were evaluated using the obtained liquid ejection head. The printing evaluation was performed according to the following criteria. Specifically, the printer used for the measurement was PIXUS TS6330 manufactured by Canon Inc. In this measurement, pigment black ink was used for printer output, the output image was read by a scanner, and landing accuracy was evaluated from the amount of deviation from the target position.

A: Landing accuracy is 3 µm or less
B: Landing accuracy is more than 3 µm and 5 µm or less
C: Landing accuracy is more than 5 µm The results are shown in Table 1. Good printing performance was obtained in Examples 1 to 7, and the printing quality of Example 7 was particularly excellent. Meanwhile, in Comparative Example 1, the print quality was degraded. It is considered that in Examples 1 to 7, the landing accuracy is good because the ink flow paths and nozzles have a shape that was precisely patterned.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-176486, filed Oct. 28, 2021, which is hereby incorporated by reference herein in its entirety.

What is claimed is:

1. A method for manufacturing a microstructure comprising cured products of photosensitive resin compositions, the method comprising:
    a step of forming at least two layers of the photosensitive resin compositions each comprising a photopolymerization initiator;
    a step of subjecting each of the formed at least two layers of the photosensitive resin compositions to patterning exposure; and
    a step of collectively developing the exposed at least two layers of the photosensitive resin compositions to obtain a microstructure,
    wherein in the at least two layers of the photosensitive resin compositions, 90% by mass or more of photopolymerization initiator content in at least one of two adjacent layers of the photosensitive resin compositions is a nonionic photopolymerization initiator.

2. The method according to claim 1, wherein the nonionic photopolymerization initiator is a photobase generator.

3. The method according to claim 2, wherein the photobase generator is at least one selected from the group consisting of imidazole-based photobase generators and amine-based photobase generators.

4. The method according to claim 2, wherein the photosensitive resin composition comprising the photobase generator further comprises a sensitizer.

5. The method according to claim 2, wherein the photosensitive resin composition comprising the photobase generator further comprises a base proliferating agent.

6. The method according to claim 1, wherein the photosensitive resin composition comprises an epoxy resin.

7. The method according to claim 6, wherein the epoxy resin is at least one selected from the group consisting of alicyclic epoxy resins, novolak type epoxy resins, 1,6-dihydroxynaphthalene type epoxy resins and bisphenol S type epoxy resins.

8. The method according to claim 1, wherein the at least two layers of the photosensitive resin compositions are only two layers of photosensitive resin compositions.

9. The method according to claim 1, wherein in the step of patterning exposure, the layer in which the nonionic photopolymerization initiator is included at the photopolymerization initiator content of 90% by mass or more, of the at least two layers of the photosensitive resin compositions, is located on an opposite side of the light source in an exposure irradiation direction.

10. A method for manufacturing a liquid ejection head comprising the method according to claim 1, wherein:
    the liquid ejection head comprises a substrate, a flow path forming member which is provided on the substrate and forms a liquid flow path, and an ejection port forming member which is provided on the flow path forming member and has an ejection port for ejecting the liquid;
    the step of forming the at least two layers of the photosensitive resin compositions is a step of forming two layers of a layer of a first photosensitive resin composition and a layer of a second photosensitive resin composition in this order on the substrate; and
    the flow path forming member is a cured product of the first photosensitive resin composition, and the discharge port forming member is a cured product of the second photosensitive resin composition.

\* \* \* \* \*